United States Patent [19]
Bergemont

[11] Patent Number: 5,409,854
[45] Date of Patent: Apr. 25, 1995

[54] METHOD FOR FORMING A VIRTUAL-GROUND FLASH EPROM ARRAY WITH FLOATING GATES THAT ARE SELF ALIGNED TO THE FIELD OXIDE REGIONS OF THE ARRAY

[75] Inventor: Albert M. Bergemont, Santa Clara, Calif.

[73] Assignee: National Semiconductor Corporation, Santa Clara, Calif.

[21] Appl. No.: 213,903

[22] Filed: Mar. 15, 1994

[51] Int. Cl.[6] .................................. H01L 21/265
[52] U.S. Cl. .................................. 437/43; 437/48; 437/984; 257/215; 257/316
[58] Field of Search ............ 437/43, 48, 984, 228; 257/315, 316

[56] References Cited

U.S. PATENT DOCUMENTS 5,346,842  9/1994  Bergemont .................... 437/52

Primary Examiner—Olik Chaudhuri
Assistant Examiner—Richard A. Booth
Attorney, Agent, or Firm—Limbach & Limbach; H. Donald Nelson; Vincenzo Pitruzzella

[57] ABSTRACT

The floating gate of a virtual-ground flash electrically programmable read-only-memory (EPROM) cell, which is formed over a portion of a pair of vertically-adjacent field oxide regions, is self aligned to the field oxide regions by utilizing a stacked etch process to define the widths of both the floating gate and the field oxide regions. As a result, the pitch of the cells in the X direction can be substantially reduced.

9 Claims, 17 Drawing Sheets

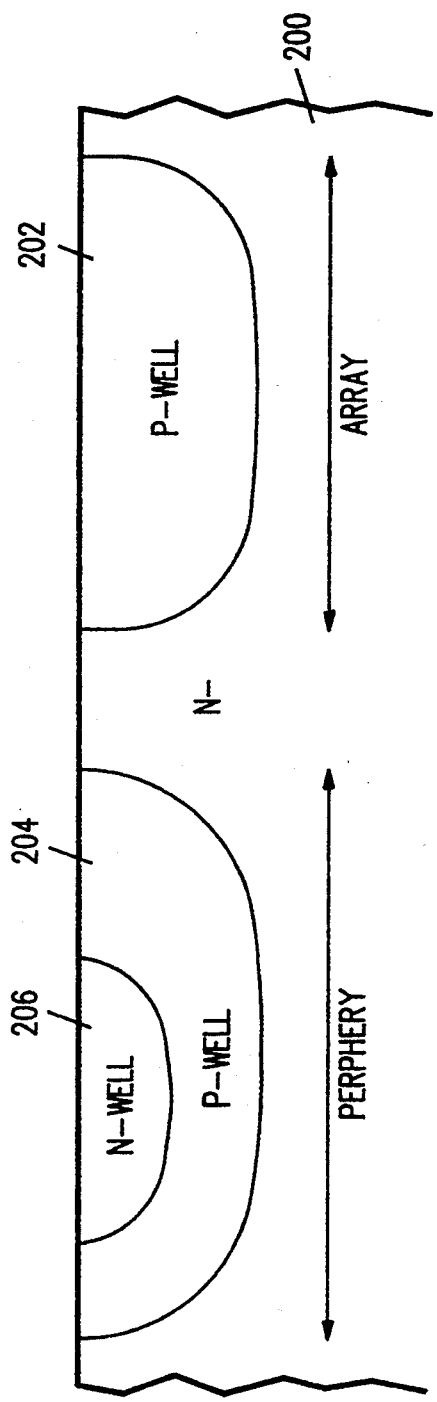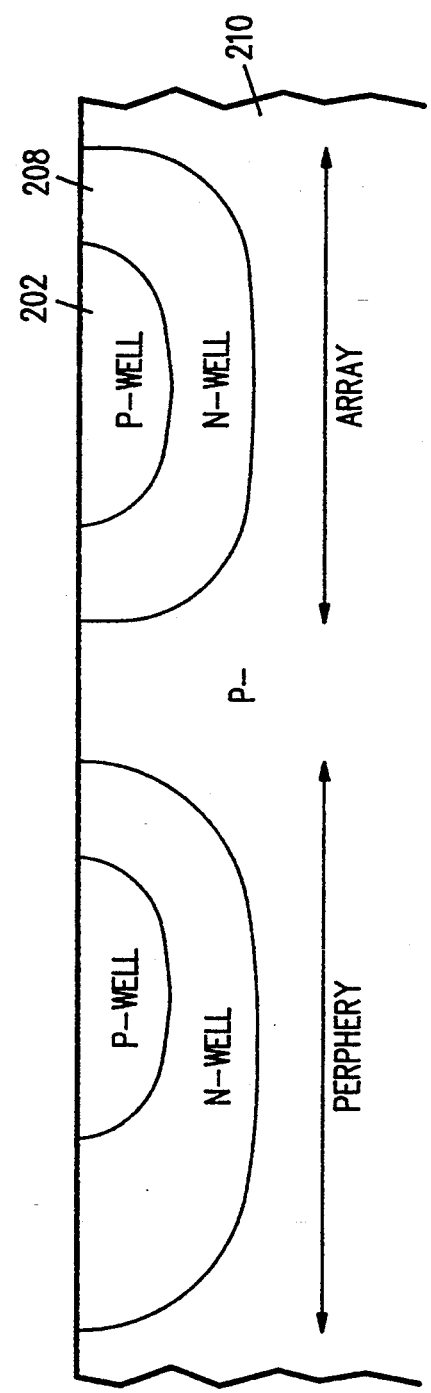

METHOD FOR FORMING A VIRTUAL-GROUND FLASH EPROM ARRAY WITH FLOATING GATES THAT ARE SELF ALIGNED TO THE FIELD OXIDE REGIONS OF THE ARRAY

BACKGROUND OF THE INVENTION

1. Field of the Invention

The present invention relates to electrically programmable read-only-memories (EPROMs) and, in particular, to a method for forming a virtual-ground flash EPROM with floating gates that are self aligned to the field oxide regions.

2. Discussion of the Related Art

A flash electrically programmable read-only-memory (EPROM) is a non-volatile memory that, like conventional EPROMs and electrically-erasable programmable read-only-memories (EEPROMs), retains data which has been stored in the memory when power is removed and which, unlike conventional EPROMs and EEPROMs, can be selectively erased.

FIG. 1 shows a plan view that illustrates a portion of a "virtual-ground" flash EPROM array 10, such as the array described in U.S. application Ser. No. 07/988,293, filed by Albert Bergemont on Dec. 8, 1992, titled HIGH DENSITY CONTACTLESS FLASH EPROM ARRAY USING CHANNEL ERASE.

As shown in FIG. 1, array 10 includes a series of memory cells 12, a series of access transistors 14, and a series of field oxide regions FOX which separate both the vertically-adjacent memory cells and access transistors of the array. In addition, each memory cell 12 and each access transistor 14 in a column of memory cells and access transistors shares a source bit line SOURCE and a drain bit line DRAIN with the remaining memory cells and access transistors in the column, and with the memory cells 12 and access transistors 14 in the horizontally-adjacent columns.

Further, a series of metal bit line contacts MBL1-MBLn in FIG. 1 are utilized to contact the drain bit lines DRAIN so that each drain bit line DRAIN is contacted by one metal bit line MBL once every 64 cells. The source bit lines SOURCE, on the other hand, are not contacted by a metal bit line.

As also shown in FIG. 1, the memory cells 12 in a row of memory cells share a common word line 16. As is well known, the portion of the word line 16 which is formed over each memory cell 12 in a row of memory cells functions as the control gate of the memory cells in that row. Similarly, the access transistors 14 in a row of access transistors share a common access select line 18.

One of the major goals in the design of a virtual-ground flash EPROM is to reduce the area consumed by each cell of the array, thereby increasing the density of the array. Conventionally, the area of a cell is measured by the pitch of the cell in the X direction and the pitch of the cell in the Y direction.

The pitch of a cell in the X direction can be defined as the distance from one edge of a field oxide region to the same edge of a horizontally-adjacent field oxide region. Thus, as shown in FIG. 1, the X cell pitch can be defined by the distance $D_1$ which represents the length of a field oxide region FOX, and by the distance $D_2$ which represents the minimum spacing between horizontally-adjacent field oxide regions FOX.

The length of the field oxide regions FOX, in turn, is defined by the distance $D_3$, which represents the width of a floating gate, plus the distances $D_4$ and $D_5$, both of which represent a misalignment width. In a conventional virtual-ground flash EPROM fabrication process, the misalignment widths $D_4$ and $D_5$ are required to assure that the floating gates will be formed over a portion of each of the vertically-adjacent field oxide regions FOX even if the floating gates are slightly misaligned.

Thus, if the floating gates could be precisely positioned, the misalignment widths $D_4$ and $D_5$ could be eliminated, thereby substantially reducing the pitch of the cells in the X direction. Therefore, there is a need for a process which precisely positions the floating gates over a portion of each of the vertically-adjacent field oxide regions FOX.

SUMMARY OF THE INVENTION

In a virtual-ground flash electrically programmable read-only-memory (EPROM) array, the floating gate of each memory cell is formed over a portion of a pair of vertically-adjacent field oxide regions. The length of the field oxide regions in the X direction is defined by the width of the floating gate plus two misalignment widths which assure that the floating gate is formed over a portion of each of the vertically-adjacent field oxide regions even if the floating gate is slightly misaligned. The present invention provides a method for eliminating the misalignment widths by self aligning the floating gate and the field oxide regions, thereby substantially reducing the pitch of the cell in the X direction.

In accordance with the present invention, a method of fabricating a virtual-ground flash electrically programmable read-only-memory (EPROM) begins by providing a semiconductor substrate with an N-type conductivity. Following this, a P-well region is formed in the semiconductor substrate. Next, a plurality of spaced-apart parallel strips of field oxide are formed in the P-well region. After the strips of field oxide have been formed, the P-well region between adjacent strips of field oxide is implanted with a P-type dopant to set a channel threshold voltage. Following this, a layer of first dielectric material is formed over the P-well region between adjacent strips of field oxide. Next, a layer of conductive material is formed over the strips of field oxide and the layer of first dielectric material which is formed between adjacent strips of field oxide, followed by the formation of a layer of second dielectric material over the layer of conductive material. Once the layer of second dielectric material has been formed, a plurality of unmasked, spaced-apart parallel strips of second dielectric material are defined perpendicular to the strips of field oxide. The unmasked strips of second dielectric material and the layer of conductive material underlying the unmasked strips of second dielectric material are then etched away. As a result of this etching step, the strips of field oxide and the layer of first dielectric material which underlie the unmasked strips of second dielectric material are exposed, thereby defining a plurality of exposed regions of field oxide and a plurality of exposed regions of first dielectric material. Following this, the exposed regions of field oxide and the exposed regions of first dielectric material are etched away until the exposed regions of field oxide have been removed.

A better understanding of the features and advantages of the present invention will be obtained by reference to the following detailed description and accompanying drawings which set forth an illustrative embodi-

BRIEF DESCRIPTION OF THE DRAWINGS

FIGS. 2A-2B are cross-sectional diagrams illustrating the formation of the triple-well structure.

DETAILED DESCRIPTION

Figure 1:
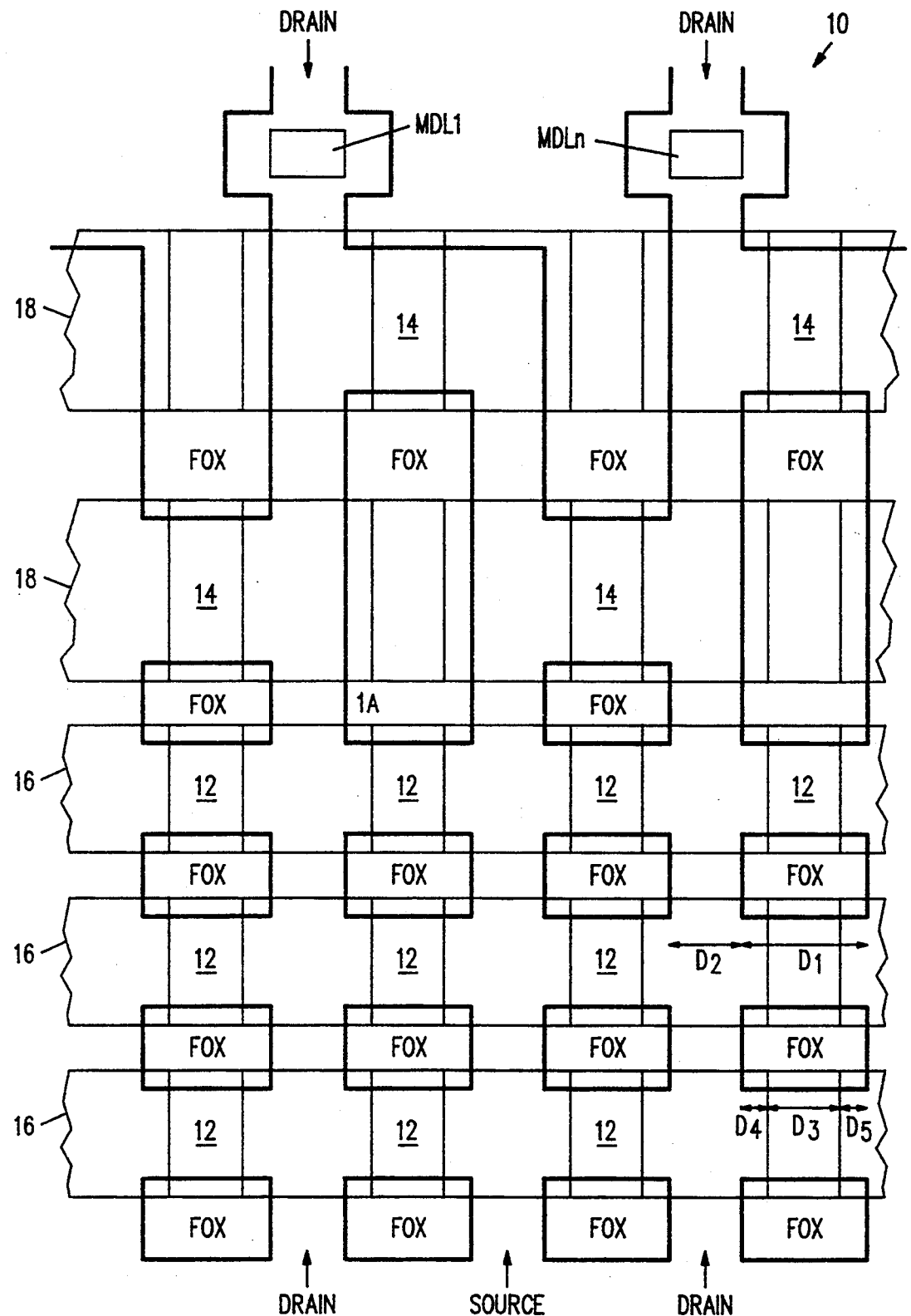
FIG. 1 is a plan view illustrating a portion of a "virtual-ground" flash EPROM array 10.

FIGS. 2-17 show plan and cross-sectional views that illustrate the steps for forming a "virtual-ground" flash electrically programmable read-only-memory (EPROM) in accordance with the present invention. As described above, the length of the field oxide regions in the X direction is defined by the width of the floating gate plus two misalignment widths which assure that the floating gates are formed over a portion of each of the vertically-adjacent field oxide regions even if the floating gates are slightly misaligned.

As described in greater detail below, the present invention eliminates the misalignment widths by utilizing the same stacked etch process to define the width of both the floating gates and the field oxide regions. By eliminating the misalignment widths, the length of the field oxide regions in the X direction, as well as the pitch of the memory cells, can be significantly reduced, thereby substantially increasing the density of the EPROM array.

The process of the present invention, which will be described with respect to a 0.6 micron photolithographic process, begins with the formation of a triplewell structure. FIGS. 2A-2B show cross-sectional diagrams that illustrate the formation of the triple-well structure. As shown in FIG. 2A, the triple-well structure is first formed by growing a layer of first oxide (not shown) approximately 500 Å thick over a semiconductor substrate 200. A P-type implant mask is then formed over the layer of first oxide and patterned to define two P-type implant regions.

Following this, the unmasked areas are implanted with a P-type dopant to form a P-well region 202 and a P-well region 204. As further shown in FIG. 2A, P-well region 202 defines an array portion of the substrate, while P-well region 204 defines a peripheral portion of the substrate. Next, the P-type implant mask is stripped and a thermal drive-in step is performed to further define the P-well regions 202 and 204. The layer of first oxide is then removed.

After the layer of first oxide has been removed, a layer of second oxide (not shown) approximately 500 Å thick is grown over the semiconductor substrate 200. An N-type implant mask is then formed over the layer of second oxide and patterned to define an N-type implant region within P-well 204. Following this, an N-type dopant is implanted into the unmasked areas to define an N-well region 206.

Once N-well region 206 has been formed, the N-type implant mask is stripped and a further drive-in step is performed to further define the N-well region 206 and the P-well regions 202 and 204. Following the drive-in step, the layer of second oxide is removed. The fabrication steps utilized to form the triple-well structure are conventional and well known in the art.

Alternately, as shown in FIG. 2B, P-well 202 can formed in an N-well 208 which, in turn, is formed in a substrate 210 of P-type conductivity. The important feature of the triple-well structure shown in FIGS. 2A and 2B is the provision of a P-well formed in N-type silicon.

Figure 3:
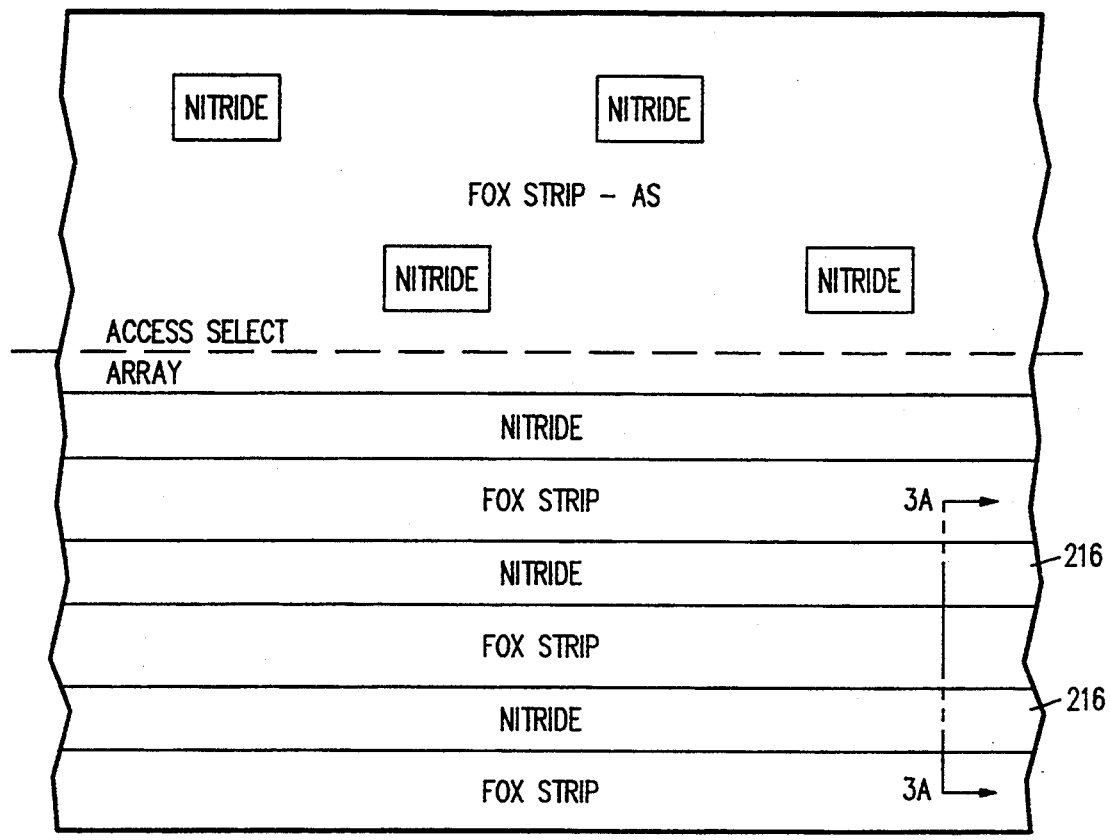
FIG. 3 is a plan view illustrating the initial formation of the field oxide regions in accordance with the present invention.
Figure 4:
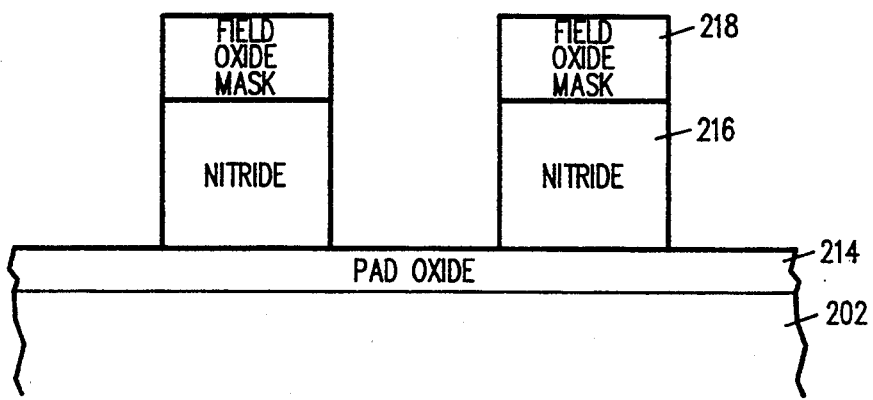
FIGS. 4 and 5 are cross-sectional diagrams taken along lines 3A—3A of FIG. 3.
Figure 5:
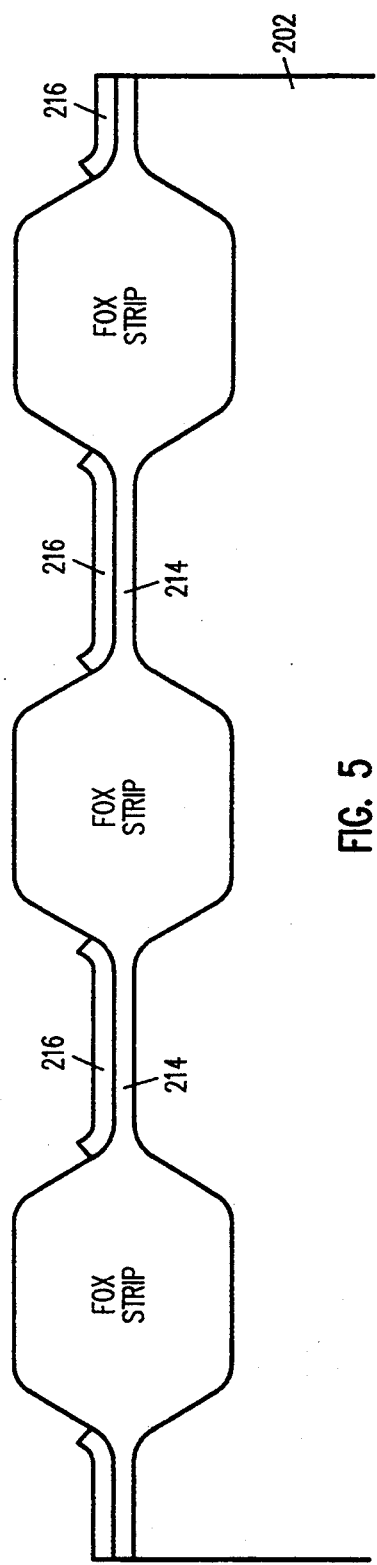

The next step, following the formation of the triple-well structure, is the initial formation of a plurality of field oxide regions in P-well regions 202 and 204, and N-well region 206. FIG. 3 shows a plan view that illustrates the initial formation of the field oxide regions in P-well 202. FIGS. 4 and 5 show cross-sectional diagrams taken along lines 3A—3A. As shown in FIG. 3, P-well region 202 includes an access select region, where the to-be-formed access transistors will be formed, and an adjoining array region, where the to-be-formed memory cells will be formed.

Referring to FIG. 4, the field oxide regions are first formed by growing a layer of pad oxide 214 approximately 200 Å thick over P-well 202, the substrate, and the remaining P and N wells. This is followed by the deposition of an overlying layer of nitride 216 approximately 2,000 Å thick.

Next, in accordance with the present invention, a field oxide mask 218 is formed over the nitride/pad oxide composite and patterned to define a plurality of nitride strips in the array region, and a plurality of nitride islands in the access select region. Following this, the unmasked areas are etched until the underlying layer of nitride 216 is removed. As a result of this etching step, strips of the underlying layer of pad oxide 214 are exposed. After the unmasked layer of nitride 216 has been removed, the field oxide mask is stripped.

Following this, a P-field implant mask (not shown) is formed and patterned to protect the to-be-formed bit lines in the array and the N-well region in the periphery. The unmasked regions of pad oxide 214 are then implanted with $BF_2$ at 50 KeV to form implant regions which have an implant concentration of approximately $4 \times 10^{-}/cm^2$. Next, the field implant mask is stripped.

Referring to FIGS. 3 and 5, after the field implant mask has been stripped, the resulting device is oxidized until a plurality of field oxide strips FOX STRIP have been grown in the array region, and a field oxide strip FOX STRIP-AS has been grown in the access select region. As shown in FIG. 3, a plurality of nitride islands remain within the field oxide strip FOX STRIP-AS.

Once the field oxide strips FOX STRIP and FOX STRIP-AS have been formed, the next step is to set the channel threshold voltages. The threshold voltages are first set by removing the nitride/pad oxide composite layer. Next, a layer of sacrificial oxide (not shown) is grown on the exposed semiconductor substrate 200, the P-wells 202 and 204, and the N-well 206. Following this, a threshold voltage mask is formed over the layer of sacrificial oxide and patterned to protect the periphery.

After the threshold voltage mask has been formed and patterned, the semiconductor substrate 202 underlying the unmasked areas of sacrificial oxide is implanted with $B_{11}$ at 40 KeV to form an implant concentration of approximately $5 \times 10^{12}/cm^2$. Following this, the threshold voltage mask is stripped and the layer of sacrificial oxide is removed. The fabrication steps utilized to set the channel threshold voltages are also conventional and well known in the art.

Figure 7:
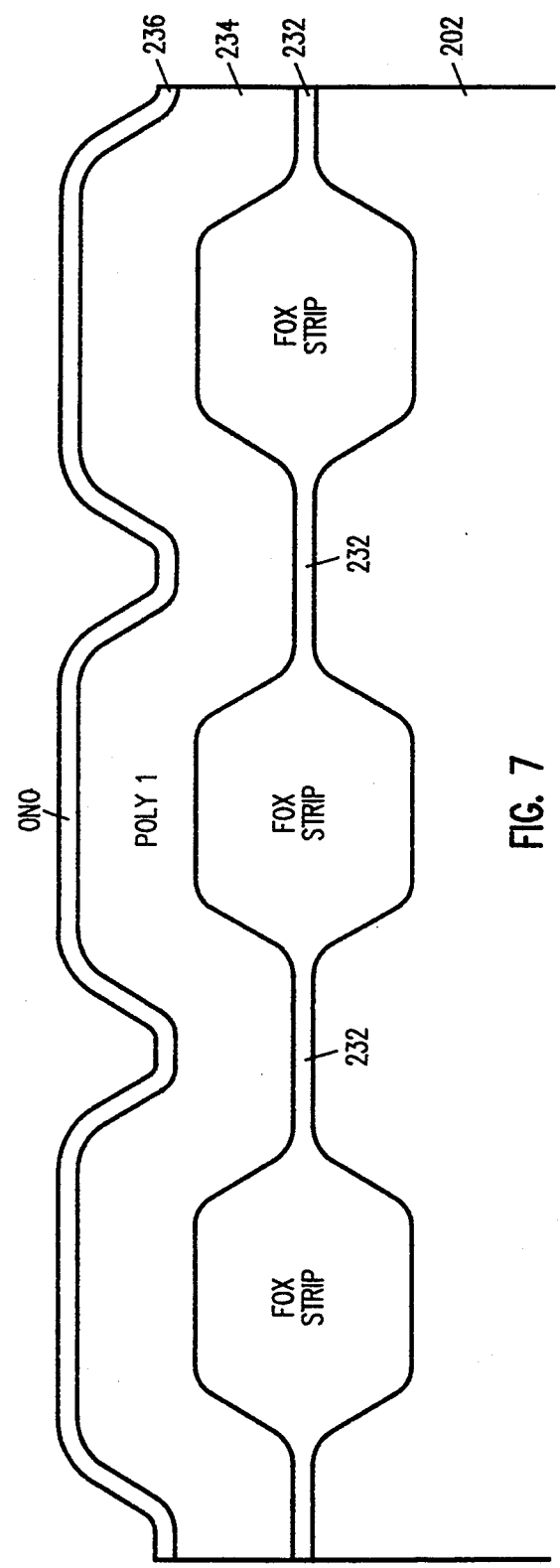
FIG. 7 is a cross-sectional diagram taken along lines 6A—6A of FIG. 6A.
Figure 6A:
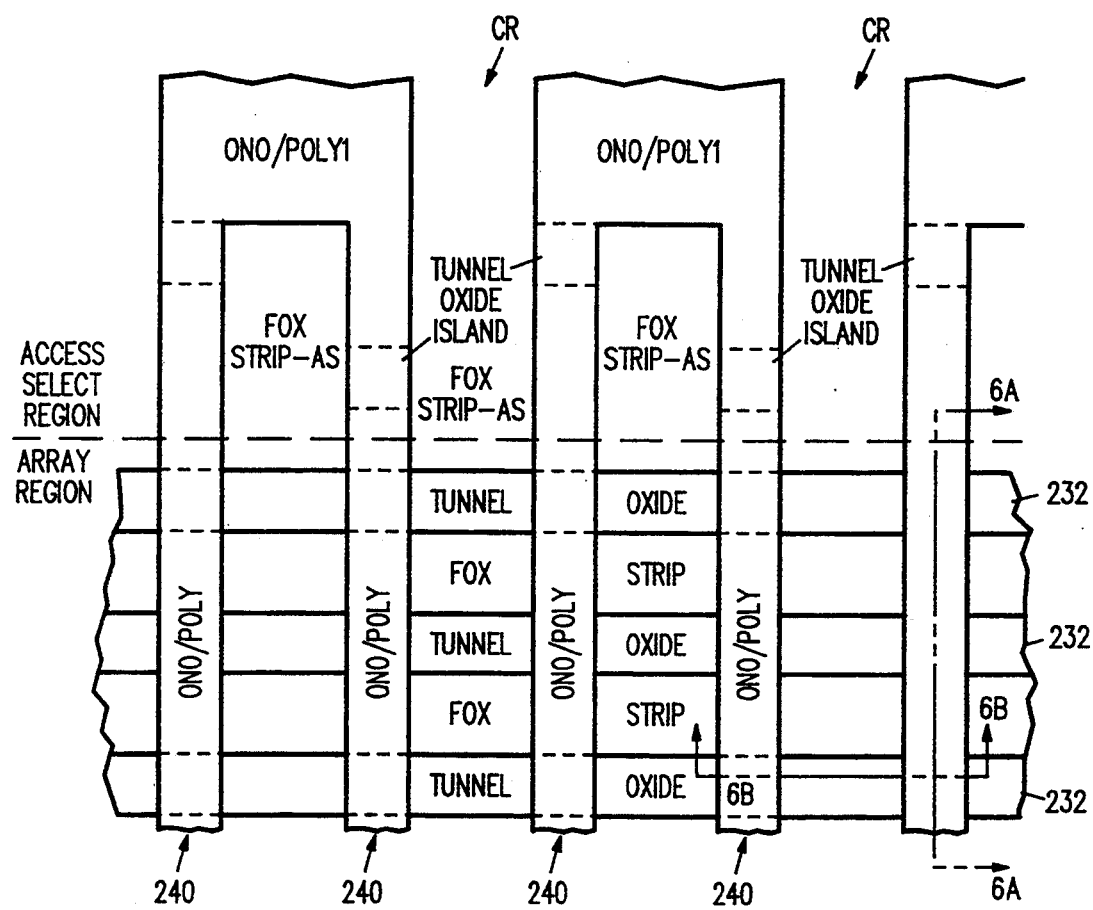
FIGS. 6A and 6B are plan views illustrating the initial formation of the floating gates in a portion of the array and access select regions.
Figure 6B:
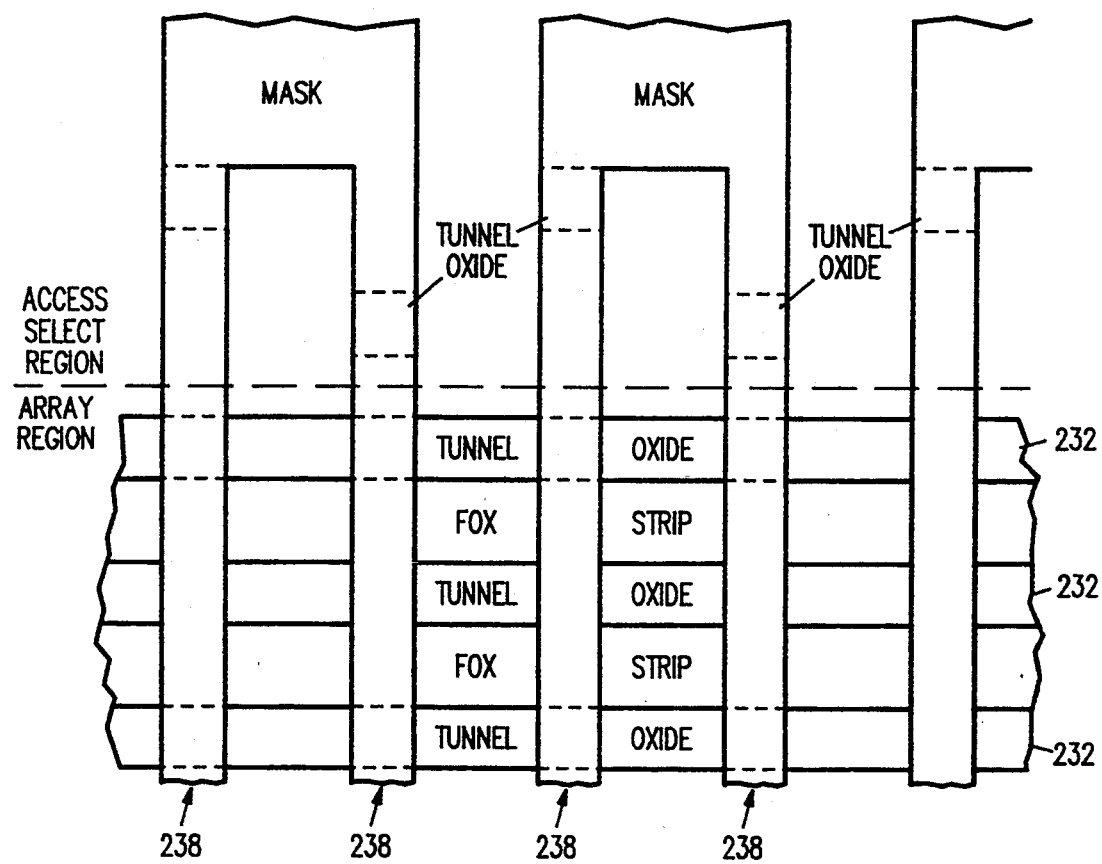
Figure 8:
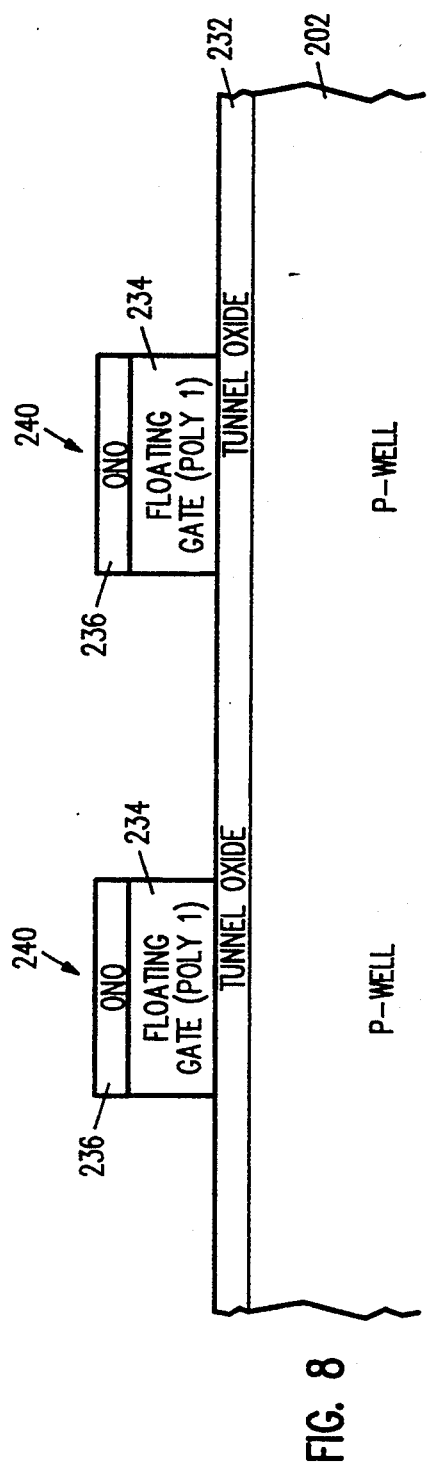
FIG. 8 is a cross-sectional diagram taken along lines 6B—6B of FIG. 6A.

After the layer of sacrificial oxide has been removed, the next step is the initial formation of the floating gates of the array. FIGS. 6A and 6B show plan views that illustrate the initial formation of the floating gates in a portion of the array and access select regions. FIG. 7 shows a cross-sectional diagram taken along lines 6A—6A. FIG. 8 shows a cross-sectional diagram taken along lines 6B—6B.

As shown in FIGS. 7 and 8, the floating gates are first formed by growing a layer of tunnel oxide 232 approximately 100–120 Å thick on the P-well 202, the semiconductor substrate and the remaining P-well and N-well. As a result, as shown in FIG. 6A, strips of tunnel oxide are formed in the array region while tunnel oxide islands are formed in the access select region. Next, referring back to FIGS. 7 and 8, a layer of polysilicon (poly1) 234 approximately 1,500 Å thick is deposited over the layer of tunnel oxide 232 and the field oxide strips FOX STRIP and FOX STRIP-AS. The layer of poly1 234 is then doped in a conventional manner. As is well known, the floating gates of the array are formed from the layer of poly1 234.

Next, a composite dielectric layer of oxide/nitride/oxide (ONO) 236 is formed on the layer of poly1 234. Following this, as shown in FIG. 6B, a photoresist mask 238 is formed over the layer of ONO 236 and patterned to define a plurality of pairs of spaced-apart parallel strips which are connected together at the ends so that each strip of each pair of strips is formed over one tunnel oxide island in each access select region. After mask 238 has been formed, the unmasked layer of ONO 236 and underlying layer of poly1 234 are then plasma etched to form spaced-apart parallel ONO/poly1 strips 240. As a result of this etching step, as shown in FIG. 6A, a portion of the layer of tunnel oxide 232 and a portion of the field oxide strips FOX STRIP and FOX STRIP-AS are exposed between each pair of ONO/poly1 strips 240.

Following this, the exposed portions of the layer of tunnel oxide 232 and the field oxide strips FOX STRIP and FOX STRIP-AS are etched with an etching chemistry which has a high selectivity to silicon, i.e., 50 to 1, until the exposed portions of the field oxide strips FOX STRIP have been removed. As a result of this etching step, a plurality of field oxide islands FOX are formed from each field oxide strip FOX STRIP and FOX STRIP-AS. As a further result of this etching step, the P-well 202 is exposed between each pair of parallel strips 240, thereby exposing a plurality of contact regions CR. The contact regions CR define the area where the to-be-formed metal bit lines will contact the to-be-formed drain bit lines.

Figure 9:
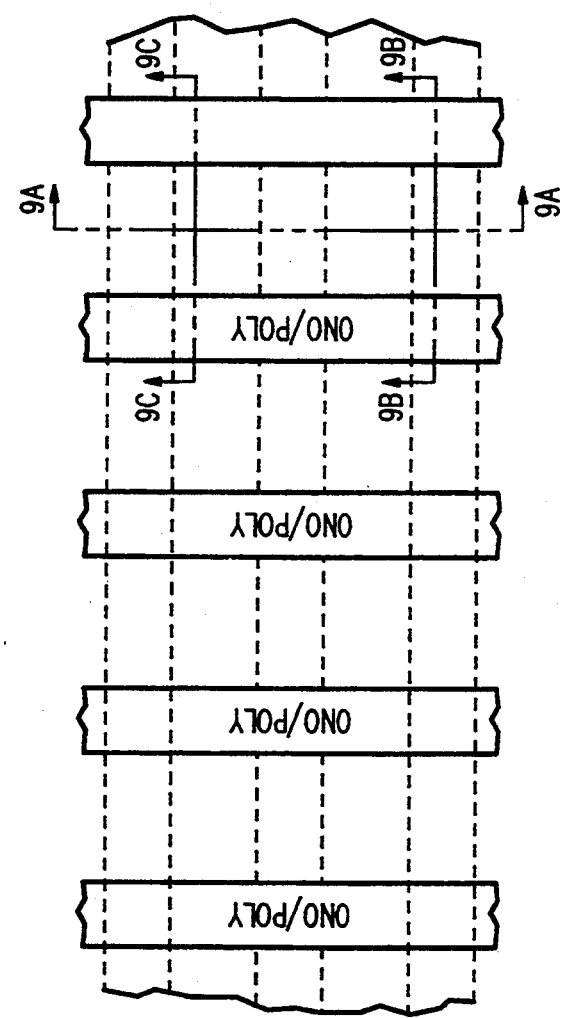
FIG. 9 is a plan view illustrating the structure that results in a portion of the array after the exposed portions of the field oxide strips FOX STRIP have been removed.
Figure 10:
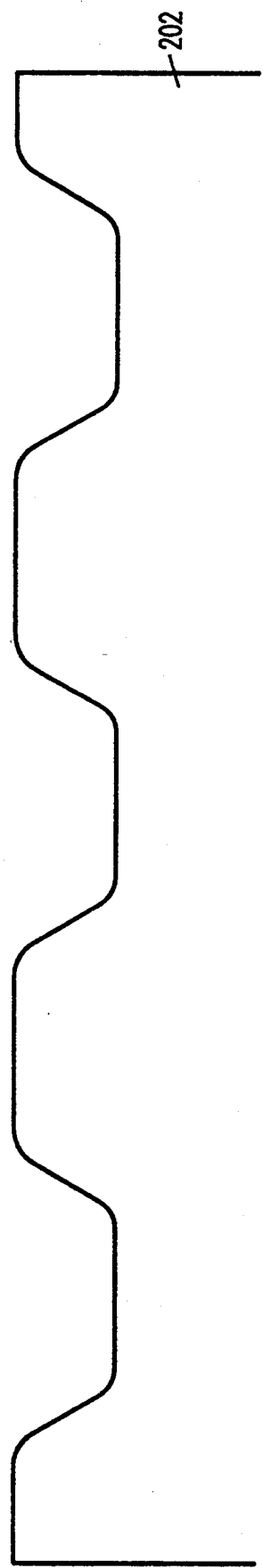
FIG. 10 is a cross-sectional diagram taken along lines 9A—9A of FIG. 9.
Figure 11:
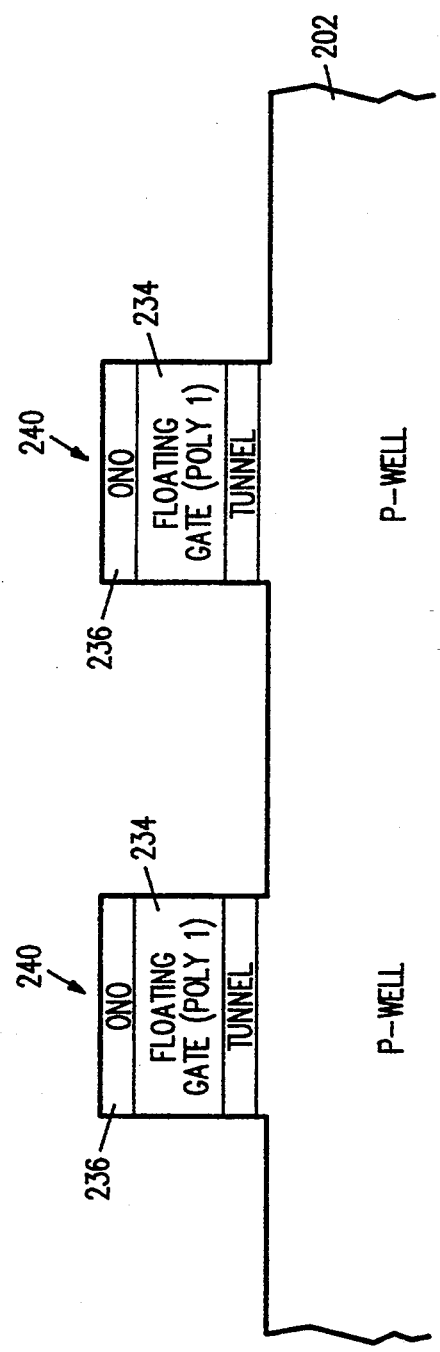
FIG. 11 is a cross-sectional diagram taken along lines 9B—9B of FIG. 9.
Figure 12:
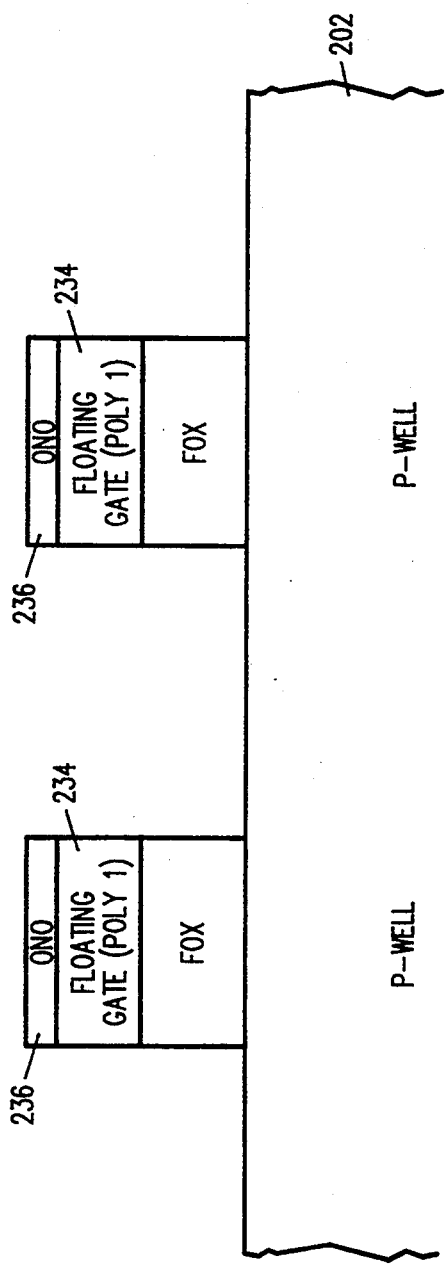
FIG. 12 is a cross-sectional diagram taken along lines 9C—9C of FIG. 9.

FIG. 9 shows a plan view of a portion of the array that illustrates the structure that results after the exposed portions of the field oxide strips FOX STRIP have been removed. FIG. 10 shows a cross-sectional diagram taken along lines 9A—9A. FIG. 11 shows a cross-sectional diagram taken along lines 9B—9B. FIG. 12 shows a cross-sectional diagram taken along lines 9C—9C.

Thus, in accordance with the present invention and as shown in FIG. 12, by utilizing the ONO/poly1 strips 240 as a mask to etch the field oxide strips FOX STRIP, the resulting field oxide islands FOX are formed with sidewalls which are self aligned to the sidewalls of the ONO/poly1 strips 240. Since the sidewalls of the field oxide islands FOX are self aligned to the sidewalls of the ONO/poly1 strips 240, the misalignment widths described above can be eliminated, thereby substantially reducing the pitch of the cells in the X direction.

After the exposed portions of the field oxide strips FOX STRIP have been removed, the photoresist mask is stripped. Next, a layer of oxide approximately 200 Å thick is grown over the exposed substrate. Following this, arsenic is implanted into the substrate 202 through the layer of oxide to form N+ source and drain bit lines 242. After the bit lines 242 have been formed, a layer of differential oxide 244 is grown over the N+ source and drain bit lines 242 and along the sides of the stacks 240.

Figure 13:
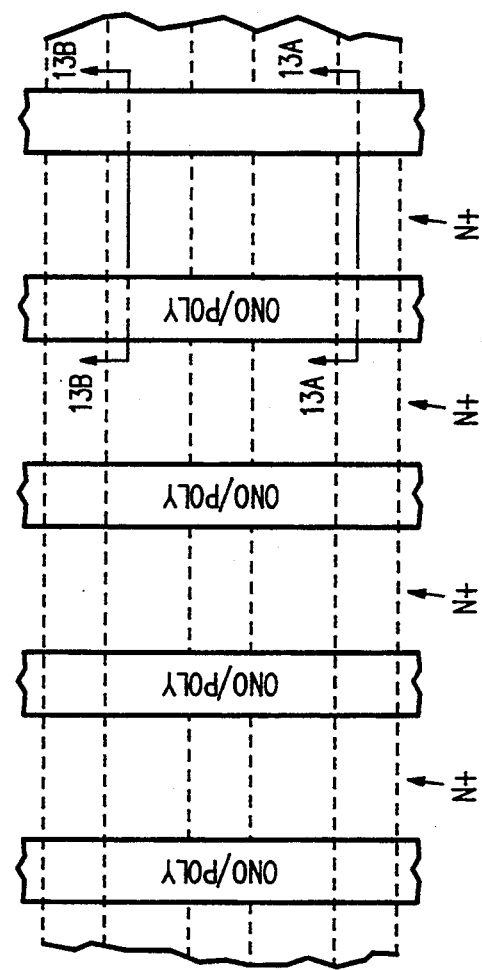
FIG. 13 is a plan view illustrating the structure that results in a portion of the array after the bit lines 242 have been formed.
Figure 14:
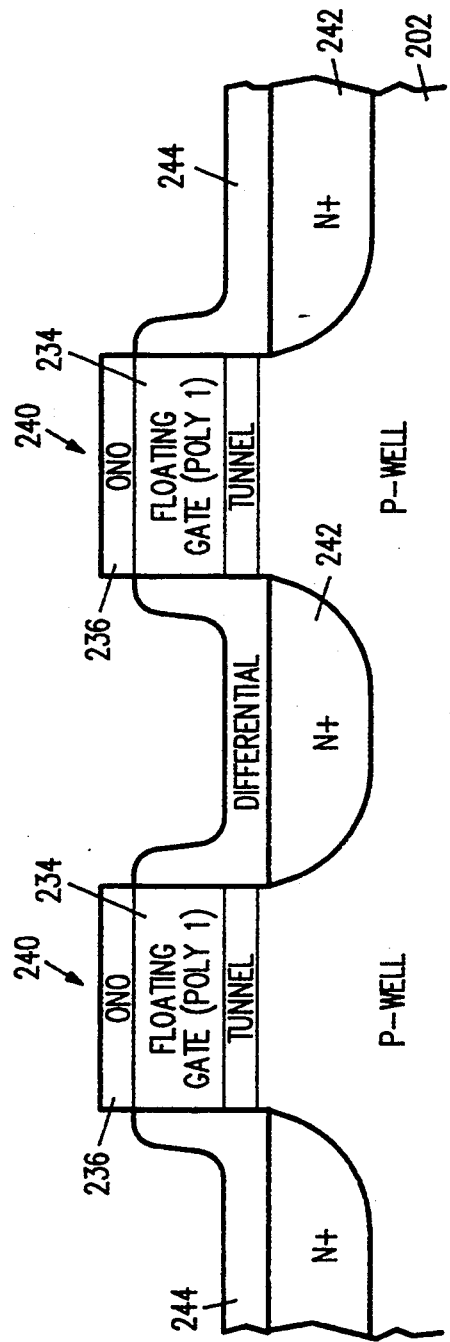
FIG. 14 is a cross-sectional diagram taken along lines 13A—13A of FIG. 13.
Figure 15:
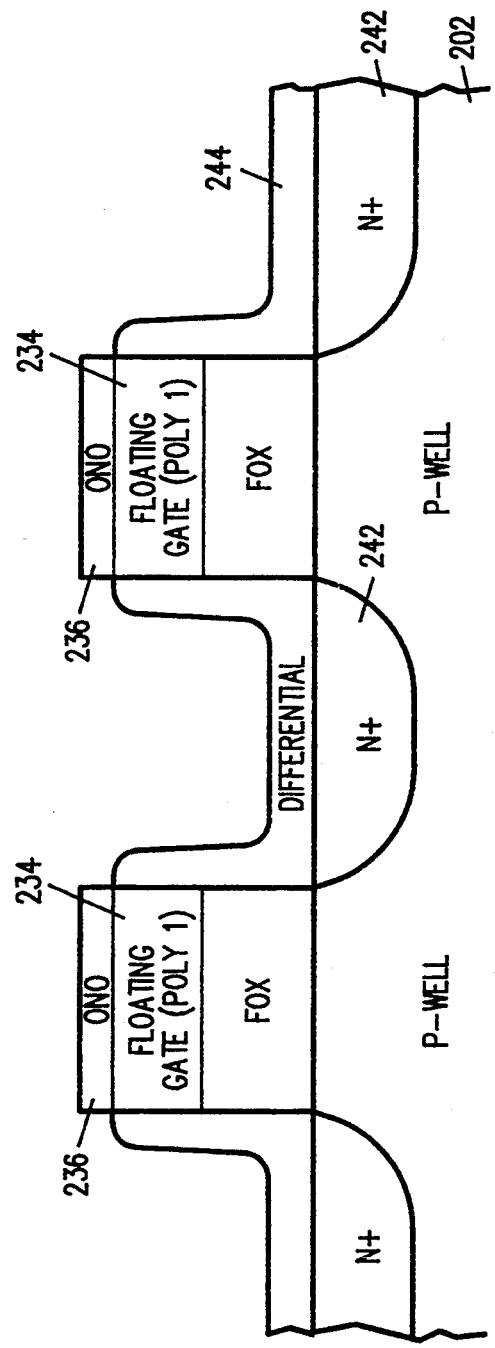
FIG. 15 is a cross-sectional diagram taken along lines 13B—13B of FIG. 13.

FIG. 13 shows a plan view of a portion of the array that illustrates the structure that results after the bit lines 242 have been formed. FIG. 14 shows a cross-sectional diagram taken along lines 13A—13A. FIG. 15 shows a cross-sectional diagram taken along lines 13B—13B.

In an alternative embodiment, after the formation of the N+ source and drain bit lines 242 and before the formation of the layer of differential oxide 244, a second source bit line mask can be formed and patterned to expose every other N+ bit line. Following this, phosphorus is implanted into the exposed bit lines to provide alternate graded N+/N− source regions for the cells of the EPROM array. The alternative embodiment results in the formation of an EPROM as described in U.S. application Ser. No. 830,938, filed by Albert Bergemont on Feb. 4, 1992, titled ALTERNATE METAL/SOURCE VIRTUAL GROUND FLASH CELL ARRAY, which is hereby incorporated by reference.

At this point, a plurality of MOS transistors are initially formed in the periphery. The typical flash EPROM includes a number of MOS transistors that function, for example, as current sense detectors, amplifiers, and address decoders. To form the peripheral MOS devices, a protect array mask (not shown) is formed over the array portion of the substrate.

Following the formation of the protect array mask, the layer of ONO, the layer of poly1, and the layer of tunnel oxide are etched from the periphery. Once the layer of tunnel oxide has been removed, the protect array mask is stripped. Next, a layer of gate oxide (not shown) approximately 150-200 Å thick is grown on the P-type semiconductor substrate 204 in the periphery.

After the layer of gate oxide has been grown, the next step is to set the channel threshold voltages for each of the to be formed MOS transistors in the periphery. The threshold voltages are set by forming and patterning a threshold mask, and then implanting a P-type dopant through the unmasked layer of gate oxide. Following this, the threshold voltage mask is stripped.

Figure 16:
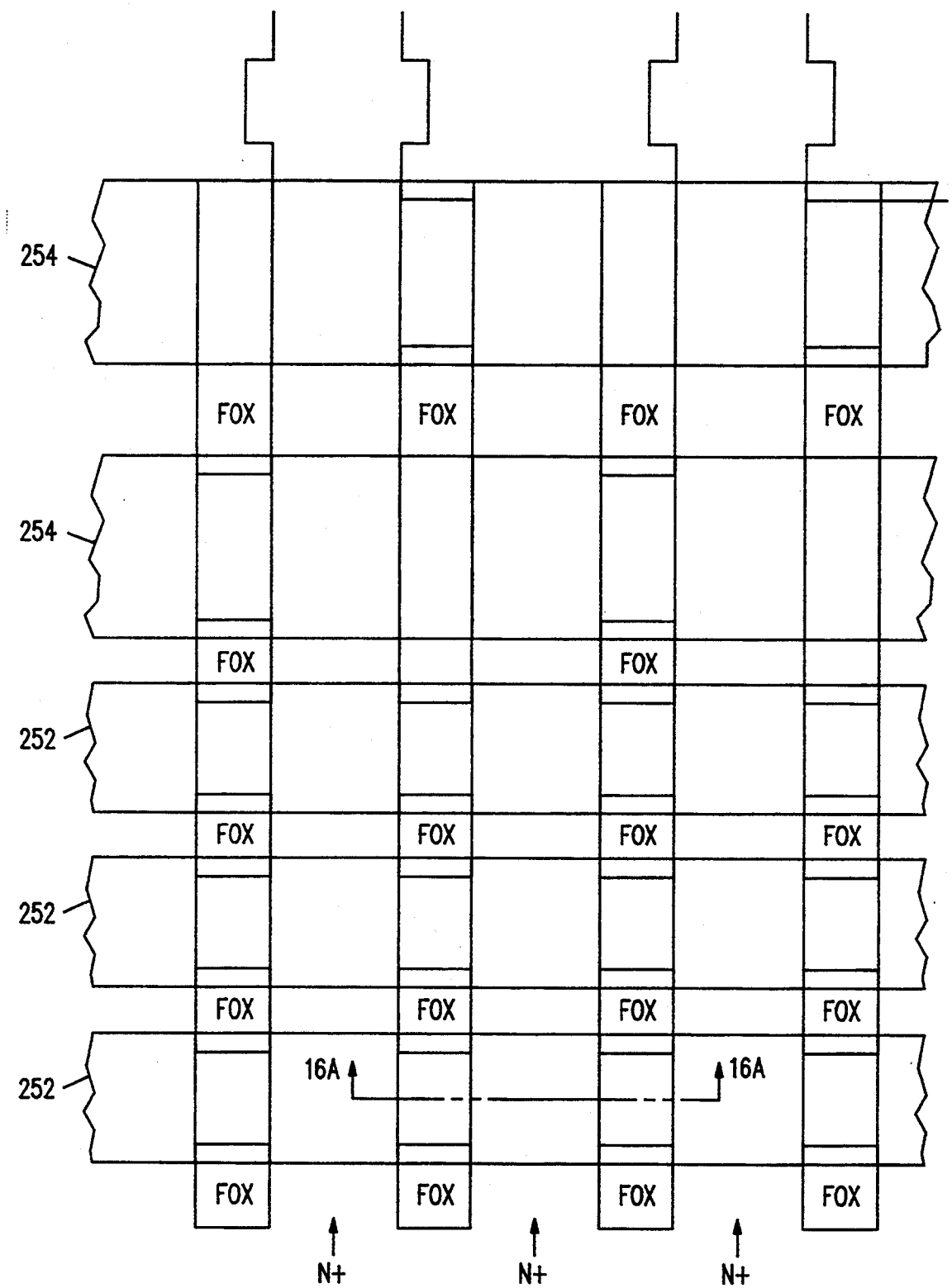
FIG. 16 is a plan view illustrating the formation of the word lines and access transistor lines.
Figure 17:
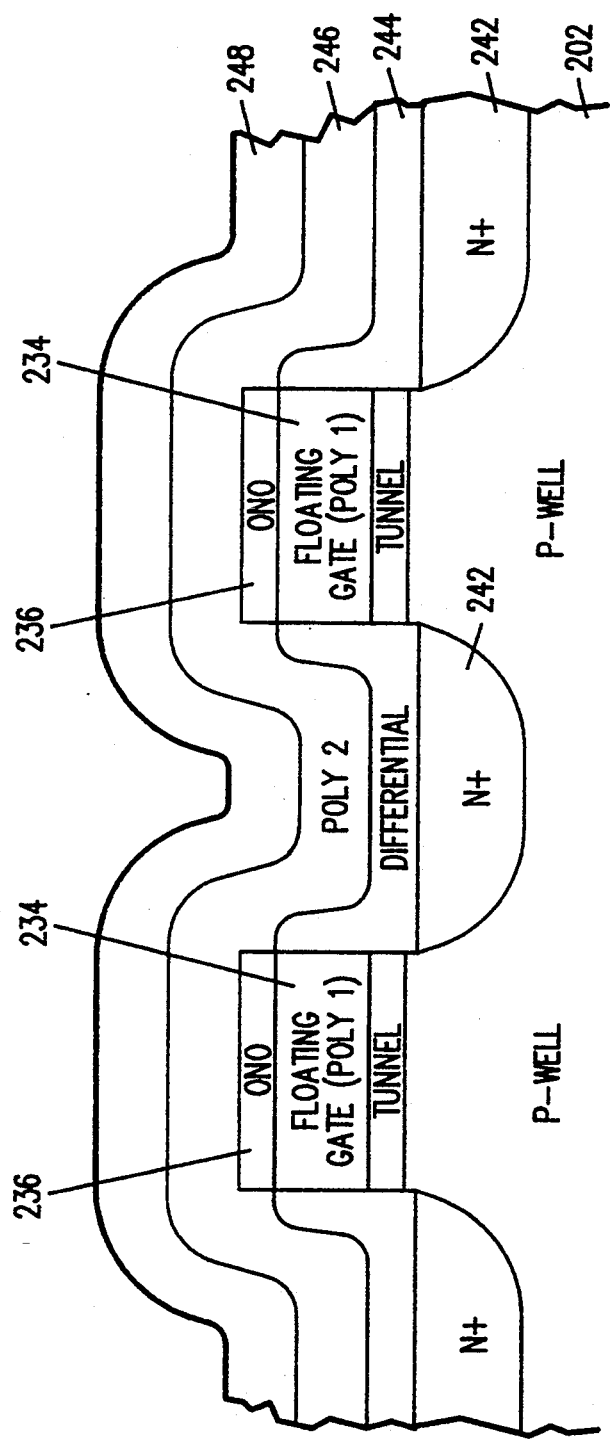
FIG. 17 is a cross-sectional view taken along lines 16A—16A of FIG. 16.

Once the plurality of MOS transistors have been initially formed in the periphery, the next step is to form the word lines and access transistor lines in the array, and the gate electrodes of the MOS transistors in the periphery. FIG. 16 shows a plan view that illustrates the formation of the word lines and access transistor lines. FIG. 17 shows a cross-sectional view taken along lines 16A—16A.

Referring to FIG. 17, after the threshold voltages of the peripheral MOS devices have been set, a layer of second polysilicon (poly2) 246 approximately 1,500 Å is deposited over the surface of the entire device and doped in a conventional manner. In the preferred embodiment, this is followed by the deposition of an overlying layer of tungsten silicide 248 approximately 2,000 Å thick. As is well known, the control gates of the cells are formed by the portion of the composite layer of tungsten silicide/poly2 that is formed over the floating gates.

A word line mask (not shown) is then formed over the tungsten silicide/poly2 composite and patterned to define a series of word lines 252 and access select lines 254 in the array, and the gate electrodes of the peripheral MOS devices. Following this, the tungsten silicide/poly2 composite is etched until the unmasked layers of tungsten silicide, and poly2 have been removed. It is noted that the access transistors are flash EPROM cells which have a larger width than the array flash EPROM cells. This allows the access transistors to drive larger currents than the array cells.

After the tungsten silicide/poly2 composite has been etched, the word line mask is UV-hardened and a self-aligned etch (SAE) mask is formed so that the overlying tungsten silicide/poly2 composite can be used as a mask for a self-aligned etch of the ONO/poly1 composite. This then is followed by a stacked etch of the ONO/poly1 composite to define each of the memory cells and access transistors of the array.

After the self-aligned etch of the ONO/poly1 composite, the SAE mask is removed. Next, a source/drain mask (not shown) is formed and patterned to define the N+ source and drain regions of the MOS devices in the periphery. Once the source/drain mask has been formed, the P-type semiconductor substrate 204 underlying the unmasked areas is implanted with arsenic through the layer of gate oxide to a depth of 0.2 to 0.3 microns. The source/drain mask is then stripped. Following this, the process follows conventional steps.

Figure 18:
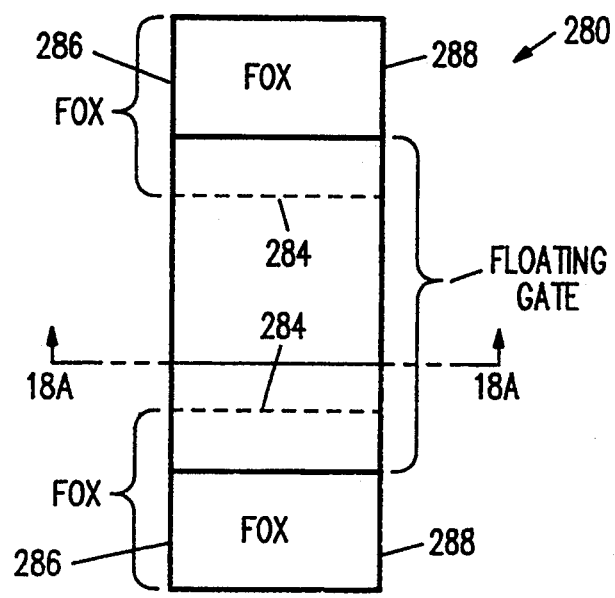
FIG. 18 is a plan view illustrating a portion a single memory cell 280 which has been formed in accordance with the present invention.
Figure 19:
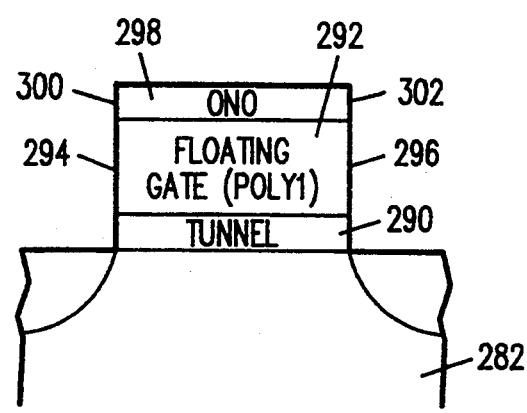
FIG. 19 is a cross-sectional diagram taken along lines 18A—18A of FIG. 18.

FIG. 18 shows a plan view that illustrates a portion a single memory cell 280 which has been formed in accordance with the present invention. FIG. 19 shows a cross-sectional diagram taken along lines 18A-18A. As shown in FIGS. 18 and 19, the memory cell 280 of the present invention includes a substrate 282 and pair of field oxide islands FOX which are formed in the substrate 282. Further, each field oxide island FOX has an inner side 284, a first outer sidewall 286, and a second outer sidewall 288.

Each cell 280 also includes a layer of first dielectric material (tunnel oxide) 290 which is formed on the substrate 282 so that the layer of first dielectric material 290 adjoins the inner side 284 of each field oxide island FOX. A layer of conductive material (poly1) 292 is formed over the layer of first dielectric material 290 and over a portion of each of the field oxide islands FOX. The layer of conductive material 292 has a first outer sidewall 294 and a second outer sidewall 296.

In addition, cell 280 also includes a layer of second dielectric material 298 which is formed over the layer of conductive material 292. The layer of second dielectric material 298 also has a first outer sidewall 300 and a second outer sidewall 302.

Thus, in accordance with the present invention, the first outer sidewalls 286 of the pair of field oxide islands FOX, the first outer sidewall 294 of the layer of conductive material 290, and the first outer sidewall 300 of the layer of second dielectric material 298 are substantially vertically aligned. Similarly, the second outer sidewalls 288 of the pair of field oxide islands FOX, the second outer sidewall 296 of the layer of conductive material 294, and the second outer sidewall 302 of the layer of second dielectric material 298 are also substantially vertically aligned.

As a result, the above-described misalignment widths can be eliminated, thereby substantially reducing the pitch of the cell in the X direction and, conversely, substantially increasing the density of the array.

Figure 20:
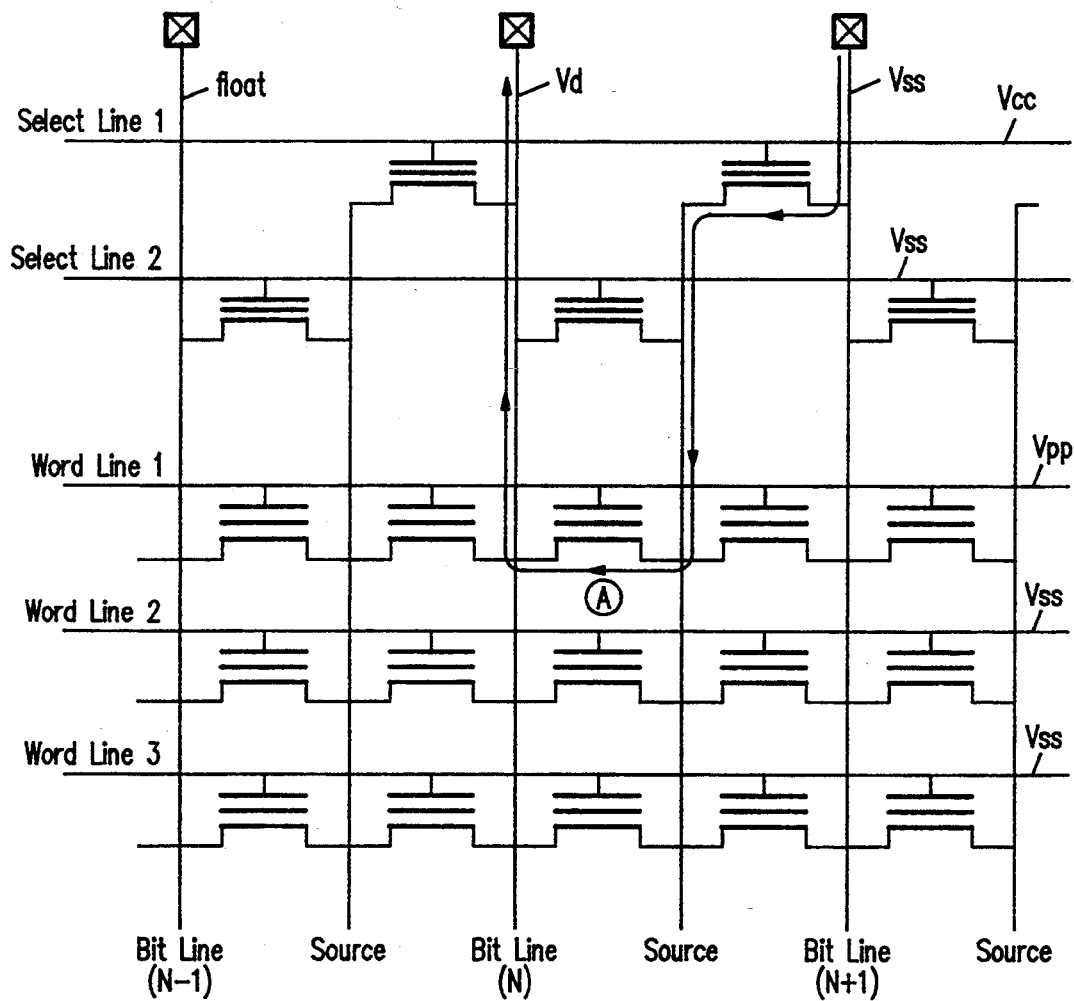
FIG. 20 is a schematic diagram illustrating how a cell is programmed.

FIG. 20 shows a schematic diagram that illustrates how a cell is programmed. As shown in FIG. 20, the above-described array is programmed in the conventional AMG manner. That is, to program cell A, the drain bit line N of cell A held at an intermediate voltage Vd (approx 5-7 V), source bit line N+1 is held at ground, and source bit line N−1 is allowed to float. Select line 1 is biased to the supply voltage Vcc (approx. 5 V) and select line 2 is held at ground. The word line WC1 associated with cell A is taken to the programming voltage Vpp (approx. 12-13 VO, while the remaining word lines (WC2/WL3) are grounded. These bias conditions result in current flow as shown by the arrow in FIG. 20, which results in electron injection from the drain of cell A to the floating gate of cell A, thus programming cell A.

Figure 21:
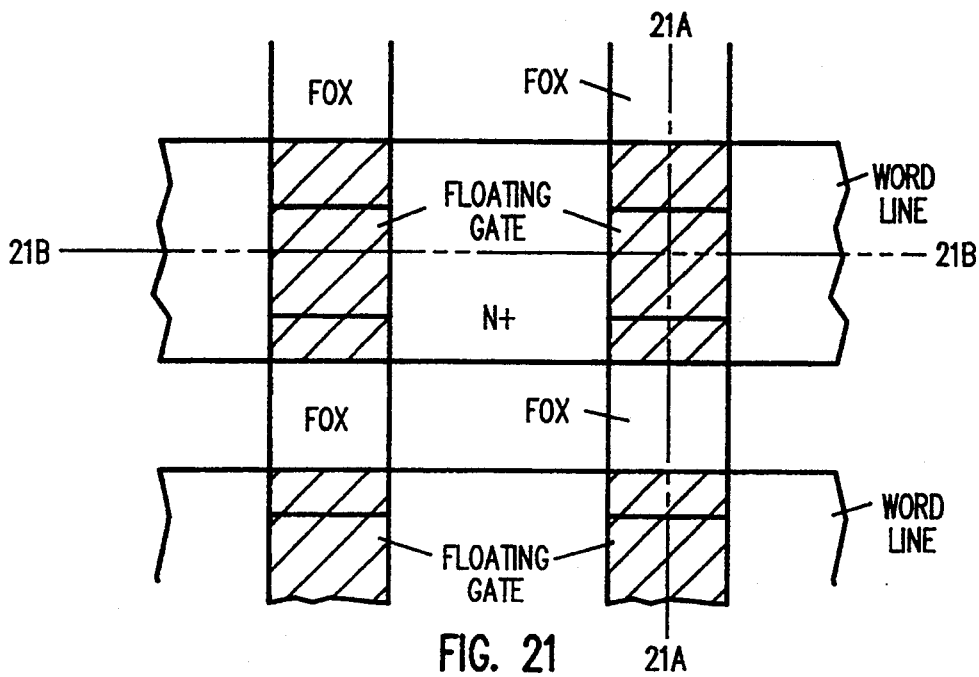
FIG. 21 is a plan diagram illustrating a portion of the array.
Figure 22:
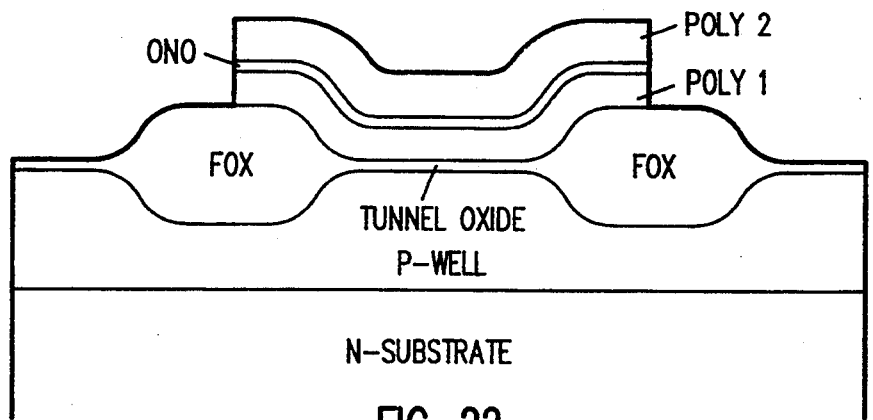
FIG. 22 is a cross-sectional diagram taken along lines 21A—21A of FIG. 21.
Figure 23:
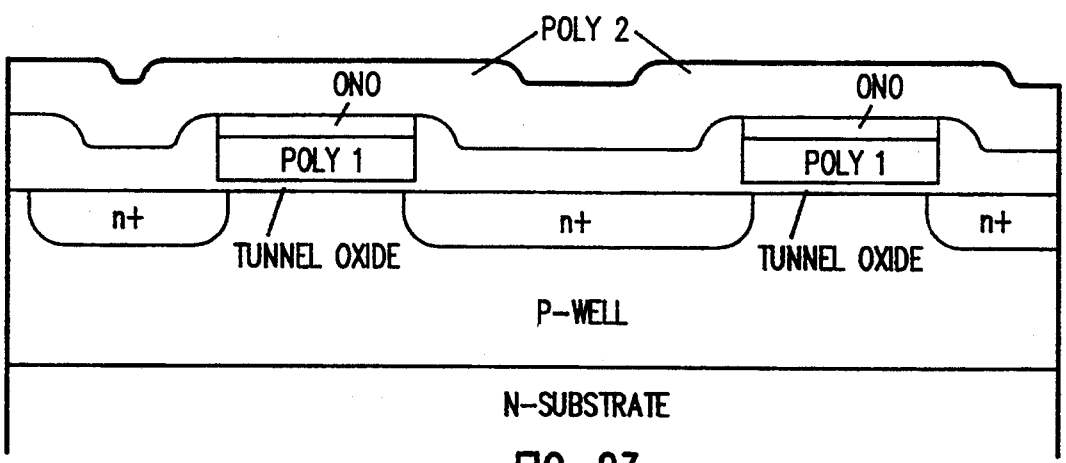
FIG. 23 is a cross-sectional diagram taken along lines 21B—21B of FIG. 21.

FIG. 21 shows a plan diagram that illustrates a portion of the array. FIG. 22 shows a cross-sectional diagram taken along lines 21A—21A of FIG. 21. FIG. 23 shows a cross-sectional diagram taken along lines 21B—21B of FIG. 21.

In the above-described flash array, erase is achieved using a "channel erase". As shown in FIGS. 21-23, this requires the formation of thin tunnel oxide about 100-120 Å thick beneath the floating gates of the EPROM cells. To compensate for the low coupling ratio induced by the thinner tunnel oxide under the floating gate, the floating gate includes poly1 "extensions" over the field oxide regions (FOX) in the array.

Figure 24:
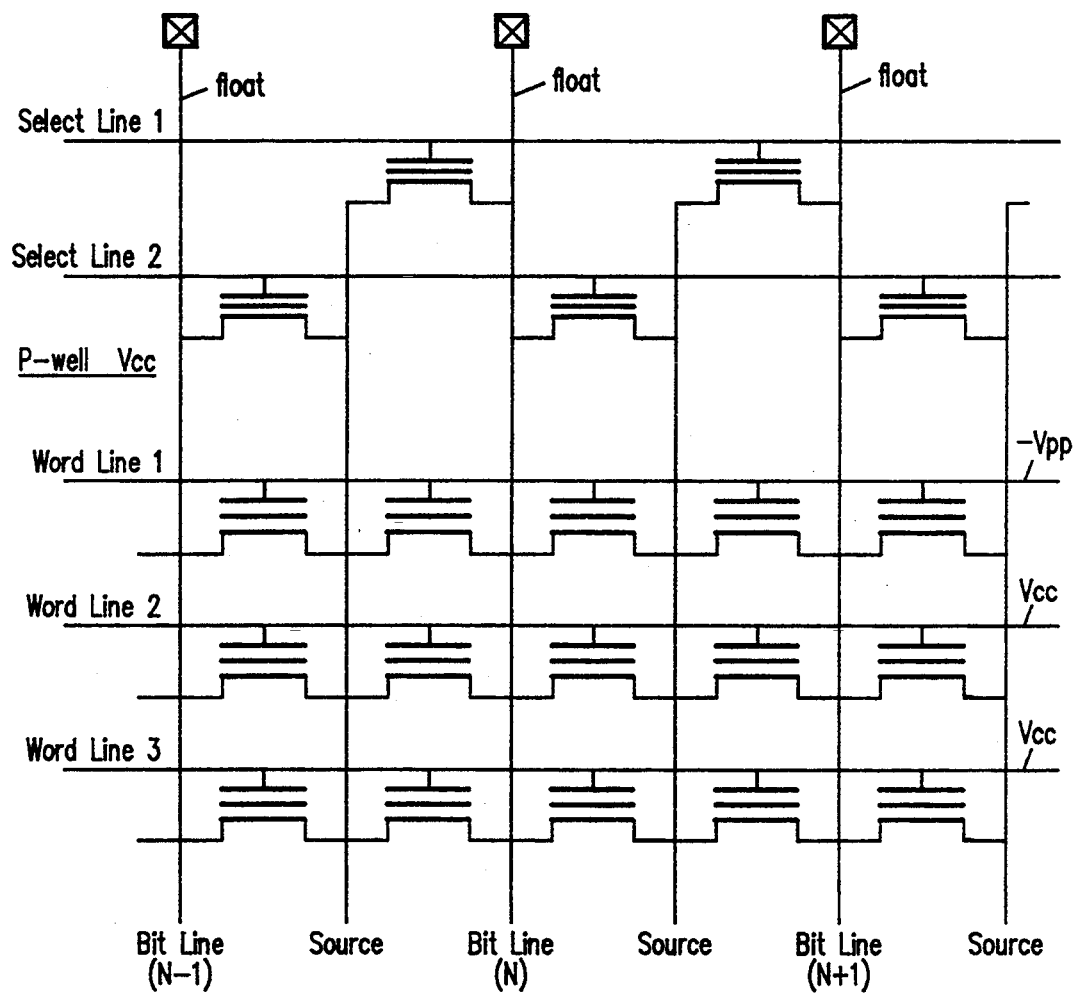
FIG. 24 is a schematic diagram illustrating the bias conditions for erasing the cells on a selected word line.
Figure 25:
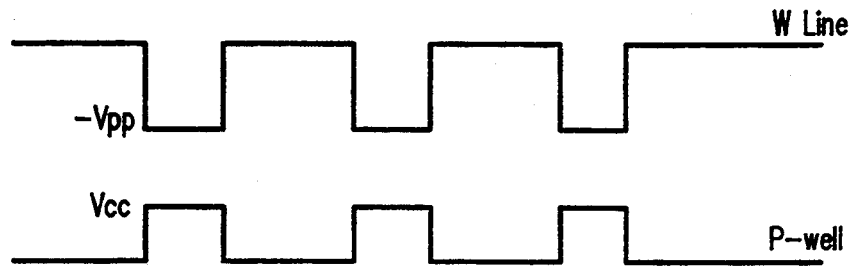
FIG. 25 is a timing diagram illustrating the waveforms of the selected word line voltage and of the P-well voltage for erasing the cells on the selected word line.
Figure 26:
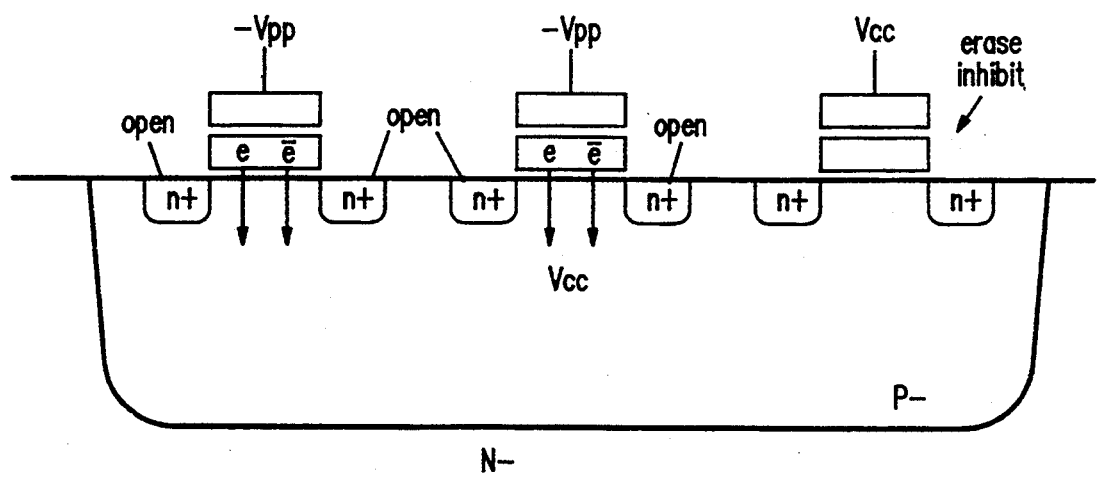
FIG. 26 is a cross-sectional diagram illustrating the erase mechanism.

FIG. 24 shows a schematic diagram that illustrates the bias conditions for erasing the cells on a selected word line. FIG. 25 shows a timing diagram that illustrates the waveforms of the selected word line voltage and of the P-well voltage for erasing the cells on the selected word line. FIG. 26 shows a cross-sectional diagram that illustrates the erase mechanism.

As shown in FIGS. 24-26, in the "channel erase" operation, a high negative voltage −Vpp (approx. −12 V to −13 V) is applied to the word line of each row in the array selected for erasure. A positive voltage Vcc (approx. 5 V) is applied to the channel area, i.e. to the p-well. The source and drain bit lines are kept open, i.e. floating. The remaining rows are "erase inhibited" by applying the supply voltage Vcc to their associated word lines. These bias conditions cause Fowler-Nordheim current to flow from the floating gates of the cells in the selected rows to the p-well. The erase operation requires low current, thus allowing the use of a high voltage negative charge pump. Furthermore, the band-to-band tunneling and the large erase currents inherent to the conventional source erase operation are eliminated, suggesting a larger cycling endurance for the channel erase device.

As stated above, in a preferred embodiment, the select transistors are flash cells with a W≧2 times the W of a cell in the array in order to pull down Vss on the intermediate node.

It should be understood that various alternatives to the embodiment of the invention described herein may be employed in practicing the invention. It is intended that the following claims define the scope of the invention and that methods and structures within the scope of these claims and their equivalents be covered thereby.

What is claimed is:

1. A method of fabricating a virtual-ground flash electrically programmable read-only-memory (EPROM), the method comprising the steps of:
   providing a semiconductor substrate having an N-type conductivity;
   forming a P-well region in the semiconductor substrate;
   forming a plurality of spaced-apart parallel strips of field oxide in the P-well region;
   implanting the P-well region between adjacent strips of field oxide with a P-type dopant to set a channel threshold voltage;
   forming a layer of first dielectric material over the P-well region between adjacent strips of field oxide;
   forming a layer of conductive material over the strips of field oxide and the layer of first dielectric material formed between adjacent strips of field oxide;
   forming a layer of second dielectric material over the layer of conductive material;
   defining a plurality of unmasked, spaced-apart parallel strips perpendicular to the strips of field oxide on the layer of second dielectric material;
   etching away the layer of second dielectric material defined by the unmasked strips, and the layer of conductive material underlying the unmasked strips, thereby exposing and defining a plurality of regions of field oxide, and a plurality of regions of first dielectric material; and
   etching away the strips of field oxide defined by the plurality of field oxide regions and the layer of first dielectric material defined by the plurality of first dielectric regions until the strips of field oxide defined by the plurality of field oxide regions have been removed.

2. The method of claim 1 wherein the layer of first dielectric material comprises an oxide.

3. The method of claim 1 wherein the layer of conductive material comprises polysilicon.

4. The method of claim 1 wherein the layer of second dielectric comprises an oxide-nitride-oxide composite.

5. A method of fabricating a virtual-ground flash electrically programmable read-only-memory (EPROM), the method comprising the steps of:
   providing a semiconductor substrate having a P-type conductivity;
   forming an N-well region in the semiconductor substrate;
   forming a P-well region in the N-well region;
   forming a plurality of spaced-apart parallel strips of field oxide in the P-well region;
   implanting the P-well region between adjacent strips of field oxide with a P-type dopant to set a channel threshold voltage;
   forming a layer of first dielectric material over the P-well region between adjacent strips of field oxide;
   forming a layer of conductive material over the strips of field oxide and the layer of first dielectric material formed between adjacent strips of field oxide;
   forming a layer of second dielectric material over the layer of conductive material;
   defining a plurality of unmasked, spaced-apart parallel strips perpendicular to the strips of field oxide on the layer of second dielectric material;
   etching away the layer of second dielectric material defined by the unmasked strips, and the layer of conductive material underlying the unmasked strips, thereby exposing and defining a plurality of regions of field oxide, and a plurality of regions of first dielectric material; and
   etching away the strips of field oxide defined by the plurality of field oxide regions and the layer of first dielectric material defined by the plurality of first dielectric regions until the strips of field oxide defined by the plurality of field oxide regions have been removed.

6. The method of claim 5 wherein the layer of first dielectric material comprises an oxide.

7. The method of claim 5 wherein the layer of conductive material comprises polysilicon.

8. The method of claim 5 wherein the layer of second dielectric comprises an oxide-nitride-oxide composite.

9. A method of fabricating a virtual-ground flash electrically programmable read-only-memory (EPROM), the method comprising the steps of:
   providing a semiconductor substrate having an N-type conductivity;

forming a P-well region in the semiconductor substrate;

forming a plurality of spaced-apart parallel strips of field oxide in the P-well region, one or more of the strips of field oxide having a plurality of P-well islands formed therein;

implanting the P-well region between adjacent strips of field oxide and the P-well islands with a P-type dopant to set a channel threshold voltage;

forming a layer of first dielectric material over the P-well region between adjacent strips of field oxide and the P-well islands;

forming a layer of conductive material over the strips of field oxide and the layer of first dielectric material formed between adjacent strips of field oxide and in the P-well islands;

forming a layer of second dielectric material over the layer of conductive material;

defining a plurality of pairs of unmasked, spaced-apart parallel strips perpendicular to the strips of field oxide on the layer of second dielectric material so that the ends of each pair of parallel strips are connected together, and so that each strip of each pair of parallel strips is formed over a P-well island;

etching away the layer of second dielectric material defined by the unmasked strips, and the layer of conductive material underlying the unmasked strips, thereby exposing and defining a plurality of regions of field oxide, and a plurality of regions of first dielectric material; and etching away the strips of field oxide defined by the plurality of field oxide regions and the layer of first dielectric material defined by the plurality of first dielectric regions until the strips of field oxide defined by the plurality of field oxide regions have been removed.

* * * * *